Figure 1:
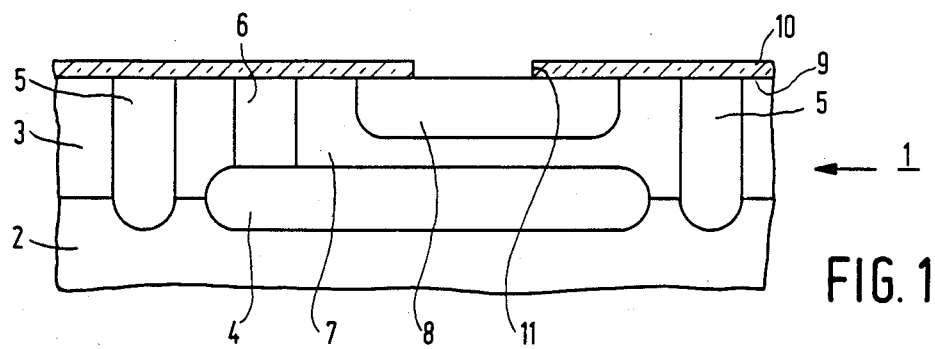

United States Patent [19]
van Dalen

[11] Patent Number: 4,725,564
[45] Date of Patent: Feb. 16, 1988

[54] METHOD OF MANUFACTURING A SEMICONDUCTOR DEVICE, IN WHICH A DOPANT IS DIFFUSED FROM ITS OXIDE INTO A SEMICONDUCTOR BODY

[75] Inventor: Cornelis J. A. M. van Dalen, Nijmegen, Netherlands

[73] Assignee: U.S. Philips Corporation, New York, N.Y.

[21] Appl. No.: 1,069

[22] Filed: Jan. 7, 1987

[30] Foreign Application Priority Data

Jan. 8, 1986 [NL] Netherlands ............ 8600022

[51] Int. Cl.$^4$ ..................... H01L 21/385
[52] U.S. Cl. .................... 437/164
[58] Field of Search ............ 148/188, 186, 187

[56] References Cited

U.S. PATENT DOCUMENTS 3,748,198  7/1973  Basi et al. ............... 148/188
4,490,192 12/1984  Gupta et al. ............. 148/188
4,514,440  4/1985  Justice et al. ........... 148/188 X Primary Examiner—George T. Ozaki
Attorney, Agent, or Firm—Paul R. Miller

[57] ABSTRACT

A method of manufacturing a semiconductor device, in which a layer (12) comprising silica and an oxide of a dopant is provided on a surface (9) of a silicon semiconductor body (1). The semiconductor body is then subjected to a heat treatment at a temperature at which transport of the dopant takes place from its oxide to the seminconductor body. The heat treatment is carried out at a first stage in an atmosphere comprising an inert gas to which up to 25% by volume of oxygen is added, at a second stage in an atmosphere of practically dry oxygen and then at a third stage in an atmosphere comprising oxygen and hydrogen. Thus, a doped zone is formed in the semiconductor body, while the surface is covered with an insulating layer of high quality.

6 Claims, 3 Drawing Figures

METHOD OF MANUFACTURING A SEMICONDUCTOR DEVICE, IN WHICH A DOPANT IS DIFFUSED FROM ITS OXIDE INTO A SEMICONDUCTOR BODY

The invention relates to a method of manufacturing a semiconductor device, in which a layer comprising silica and an oxide of a dopant is provided on a surface of a semiconductor body of silicon, after which the semiconductor body is subjected to a heat treatment at a temperature at which transport of the dopant takes place from its oxide to the semiconductor body.

Such a method is particularly suitable for the manufacture of semiconductor devices, which comprise doped surface zones in a semiconductor body. These zones can be provided in a simple and accurately controllable manner by means of the said method.

U.S. Pat. No. 3,748,198 discloses a method of the kind mentioned in the opening paragraph, in which different ways are indicated in which the layer comprising silica and the oxide of the dopant can be provided on the surface of the semiconductor body. For example, the layer may be provided by applying by spinning a slurry comprising silica and an oxide of a dopant—such as boron oxide or arsenic oxide—in a suitable liquid. By a subsequent heat treatment, the liquid is expelled from the slurry, the layer then obtaining a higher density. The layer may also be provided by causing a mixture of silane and a hydride of a dopant to react with oxygen above the surface of the semiconductor body. The desired layer may also be obtained by means of such a Chemical Vapor Deposition process. In the second C.V.D. process described here, the temperature of the semiconductor body is about 800° C., while in the first (slurry) process the temperature of the semiconductor body does not exceed about 200° C.

After the layer of silica and the oxide of the dopant has been provided, in the known method described the semiconductor body is heated for 2 to 4 hours at 1050° C., diffusion of the dopant then occurring from its oxide into the semiconductor body.

In practice, the surface of the semiconductor body is provided with a layer of silica before the layer comprising silica and the oxide of the dopant is formed. Windows are provided in this silica layer at those areas at which the semiconductor body has to be doped. The whole is now covered with the layer comprising silica and the oxide of the dopant, which layer is now consequently in contact only within the windows with the semiconductor body. During the heat treatment, transport of the dopant from its oxide to the semiconductor body takes place only within the windows. This transport does not take place via the layer of silica. Thus, doped surface zones are formed in the semiconductor body having lateral dimensions which are substantially as large as those of the windows.

It is difficult to remove the layer comprising silica and the oxide of the dopant after termination of the diffusion process because this layer is etched in usual etchants at the same speed as the subjacent layer of silica. In practice, both layers are therefore wholly removed from the surface of the semiconductor body, after which a fresh layer of silica is provided again. The latter layer can then be provided with contact windows for contacting the doped surface zones formed.

It clearly appears from the foregoing that it is very desirable that the layer comprising silica and the oxide of the dopant need not be removed after termination of the diffusion process. More particularly if this layer is provided by means of a slurry comprising silica and oxide of the dopant, it appears, however, that this layer in modern semiconductor devices is of insufficient quality to serve as an insulating layer. Such a layer is not entirely dense and has pin-holes.

The invention has inter alia for its object to provide a method by which it is possible to dope a semiconductor body from a layer comprising silica and an oxide of the dopant, after which the layer need not be removed, but may serve inter alia as an insulating layer.

For this purpose, according to the invention, the method mentioned in the opening paragraph is characterized in that the heat treatment is carried out at a first stage in an atmosphere comprising an inert gas to which up to 25% by volume of oxygen is added, after which it is carried out at a second stage in an atmosphere of practically dry oxygen and then at a third stage in an atmosphere comprising oxygen and hydrogen.

At the first stage of the heat treatment, the actual transport of the dopant takes place from its oxide to the semiconductor body. At the second stage, silicon of the semiconductor body is converted near the transition with the layer of silica and the oxide of the dopant into a thin layer of silica. A further transport of the dopant to the semiconductor body has thus become impossible. At the third stage of the heat treatment, the semiconductor body is further oxidized.

The formation of the thin layer of silica on the surface of the semiconductor body during the second stage of the heat treatment is of major importance. Thus, surface states are prevented from being obtained near the transition between the semiconductor body and the insulating layer present on its surface. If the third stage of the heat treatment is carried out without the second stage first being carried out, it appears that surface states are obtained near the transition between the semiconductor body and the insulating layer present thereon and these surface states cannot be eliminated by heat treatments in, for example, nitrogen or hydrogen.

The quantity of the dopant reaching the semiconductor body during the first stage of the heat treatment diffuses during the second and third stages of the heat treatment further into the semiconductor body. By the use of the method according to the invention, a comparatively shallow doped semiconductor zone can be formed. Since the layer comprising silica and the oxide of the dopant can be maintained, the silica layer formed under it need not be so thick in order to obtain a desired overall insulation thickness. The third stage can therefore last comparatively short so that the semiconductor zone formed by diffusion can be comparatively shallow, at least much less deep than in the case in which the insulating layer would have to be formed by insulation throughout its thickness.

A preferred embodiment of the method according to the invention is characterized in that a layer comprising silica and phosphorus pentoxide is provided on the surface of a semiconductor body. Apart from the fact that an n-type zone is formed by means of such a layer, the use thereof affords an additional advantage. The layer comprising silica and phosphorus pentoxide will slightly flow out at the temperatures at which the semiconductor body is heated during the heat treatment. The insulating layer formed consisting of the layer of thermal oxide and a phosphorus-containing layer of silica disposed on it will therefore extend smoothly at steps on the surface of the semiconductor body. Thus, problems in providing further layers on the surface of the semiconductor body are avoided.

Preferably, the layer comprising silica and phosphorus pentoxide is provided on the surface of the semiconductor body by application by spinning of a slurry comprising silica and phosphorus pentoxide in ethanol. This slurry can be baked out at a comparatively low temperature of about 200° C., so that before the heat treatment is carried out transport of the phosphorus to the semiconductor body practically does not yet take place. The depth of the semiconductor zone to be obtained by diffusion consequently depends only upon the way in which the heat treatment is carried out.

Preferably, the first stage of the heat treatment with the use of the slurry comprising silica and phosphorus pentoxide is carried out in an atmosphere of nitrogen to which 10 to 20% by volume of oxygen are added. Thus, the slurry layer retains its smooth surface during the heat treatment. As experiments have shown, without oxygen, depressions can be formed in the layer, as a result of which a surface in the form of an orange peel can be obtained. When phosphorus oxychloride ($POCl_3$) or phosphine ($PH_3$) is added to the inert atmosphere during the first stage of the heat treatment, evaporation of phosphorus from the layer comprising silica and phosphorus pentoxide is counteracted so that a homogeneous doping is also obtained on large wafers having a cross-section of about 125 mm.

Figure 2:
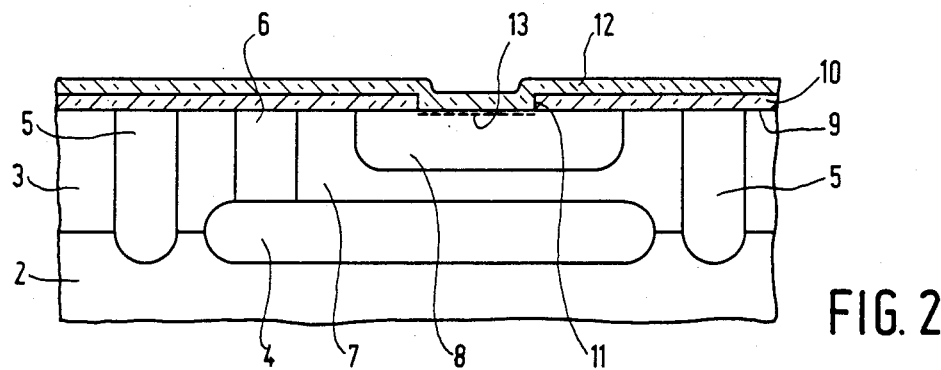
Figure 3:
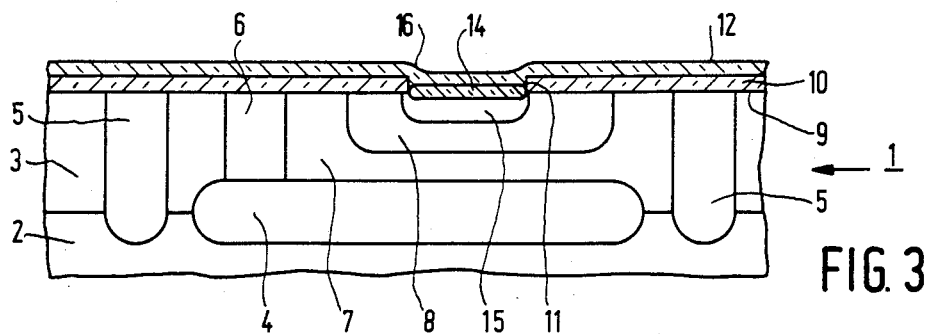

The invention will now be described more fully, by way of example, with reference to a drawing. In the drawing:

FIGS. 1 to 3 show diagrammatically in cross-section successive stages of the manufacture of a semiconductor device by means of the method according to the invention.

The figures are schematic and not to scale; especially the dimensions in the transverse direction are greatly exagerated; in the figures, the same reference numerals are used for corresponding parts. The manufacture of a bipolar transistor suitable for integrated circuits is described.

The starting material is a semiconductor body 1 comprising a p-type substrate 2 having a doping concentration of about $5.10^{15}$ atoms/cm$^3$, on which an n-type layer 3 having a doping concentration of about $7.10^{15}$ atoms/cm$^3$ is epitaxially deposited. In a usual manner, a buried n-type layer 4 having a doping concentration of about $10^{20}$ atoms/cm$^3$ is provided between the substrate 2 and the epitaxial layer 3. The epitaxial layer 3 is divided into pieces by means of p-type separation zones 5 having a doping concentration of about $5.10^{16}$ atoms/cm$^3$. The n-type contact zone 6 also provided in a usual manner and having a doping concentration of about $10^{20}$ atoms/cm$^3$ serves to contact the buried layer 4. The transistor is provided in the part 7 of the epitaxial layer 3 enclosed between the separation zones 5 and the buried layer 4.

In a usual manner, a p-type base zone 8 having a doping concentration of $10^{18}$ atoms/cm$^3$ is first provided in the n-type zone 7, which will serve as the collector zone of the transistor. Subsequently, the surface 9 of the semiconductor body 1 is provided with an insulating layer of silica 10 by heating the semiconductor body for 60 minutes at 1200° C. in steam. The silica layer 10 than has a thickness of about 1/$\mu$m. In a usual manner, a window 11 is provided in the silica layer 10 at that area at which an emitter zone has to be formed.

A layer 12 comprising silica and an oxide of a dopant, in this case an element determining the n-type, such as arsenic or phosphorus, is now provided on the surface 9 and the silica layer 10. The semiconductor body 1 is then subjected to a heat treatment at a temperature at which transport of the dopant takes place from its oxide to the semiconductor body 1, in this case to the base zone 8. According to the invention, the heat treatment is carried out in three stages. The first stage is carried out in an atmosphere comprising an inert gas to which up to about 25% by volume of oxygen is added. Transport of the dopant takes place only within the window 11 of the silica layer 10. At the first stage, a surface layer indicated diagrammatically by reference numeral 13 and rich in atoms of the dopant is obtained. At the second stage, silicon of the semiconductor body 1 is converted near the transition with the layer 12 into a thin silica layer. A further transport of the dopant to the semiconductor body 1 has thus become impossible. At the third stage, the semiconductor body is further oxidized, the oxide layer 14 then being formed. During this treatment, the atoms 13 of the dopant diffuse into the base zone 8, an emitter zone 15 then being formed. The doping concentration of this zone is about $10^{20}$ atoms/cm$^3$.

The second stage of the heat treatment is carried out in an atmosphere of practically dry oxygen, while the third stage is carried out in an atmosphere comprising oxygen and hydrogen.

It is a surprise to find that, when the second stage of the heat treatment is carried out in dry oxygen, surface stages are prevented from being obtained at the transition between the emitter zone 15 and the overlying insulating layers 14 and 12. If the second stage is omitted and the third stage of the heat treatment is carried out immediately, surface states are obtained, which cannot be eliminated even by heat treatments in nitrogen or hydrogen.

The silica layer 14 is formed over the major part of its thickness during the third stage of the heat treatment. Since this stage is carried out in an atmosphere comprising oxygen and hydrogen, this stage is effected comparatively rapidly. Therefore, the diffusion of the atoms 13 will be comparatively small. The third stage moreover need last only a comparatively short time because the insulation thickness of the insulating layer above the emitter zone 15 is determined not only by the thickness of the oxide layer 14, but also by the inspissated slurry layer 12. If the insulation thickness should be determined only by the thickness of the oxide layer 14, the heat treatment in the third stage would have to last much longer. Therefore, comparatively shallow doped zones can be obtained by means of the method according to the invention.

Preferably, a layer 12 comprising silica and phosphorus pentoxide is provided on the surface 9 by application by spinning of a slurry of both oxides in ethanol. The layer 12 will slightly flow at a temperature at which the semiconductor body 1 is heated, as a result of which after the heat treatment the layer 12 will exhibit slanting edges 16 at steps on the surface 9, such as at the edges of the window 11.

When baking out the slurry of the layer 12, in which step the ethanol disappears from the layer and a densified layer is formed, the semiconductor body is heated to a temperature not exceeding about 200° C. At this temperature, no diffusion of the dopant takes place from the layer 12 to the semiconductor body 1. The depth of the emitter zone is determined only by the procedure in the three stages of the heat treatment.

Preferably, the first stage of the heat treatment with the use of the slurry comprising silica and phosphorus pentoxide is carried out in an atmosphere of nitrogen to which 10 to 20% by volume of oxygen is added. Thus, the slurry layer retains a smooth surface during the heat treatment. Without oxygen, depressions can be formed in the layer, as shown by experiments, which results in that a surface in the form of an orange peel can be obtained.

When during the step of baking out the layer 12 phosphorus oxychloride ($POCl_3$) or phosphine ($PH_3$) is added to the inert atmosphere, evaporation of phosphorus from the layer 12 is counteracted. Thus, comparatively homogeneously doped semiconductor zones can be formed on large semiconductor wafers.

In the following embodiments, the method described above is shown in detail in steps:

a. Wafers provided with a slurry layer having a thickness of about $0.2/\mu m$ and comprising 300 $cm^3$ of silica, 300 $cm^3$ of phosphorus pentoxide and 400 $cm^3$ of ethanol per liter of slurry is baked out for about 30 minutes at 200° C. An inspissated slurry layer 12 is then left having a thickness of about $0.15/\mu m$.

b. The wafers are introduced into a furnace and heated for about 45 minutes to a temperature of 900° C. Per minute a gas mixture of 7600 scc of nitrogen and 1200 scc of oxygen is passed through the furnace.

c. Subsequently, the temperature in the furnace is increased to about 990° C., i.e. a temperature at which transport of phosphorus takes place from its oxide to the semiconductor body. In order to avoid evaporation of phosphorus from the slurry, about 75 scc per minute of phosphorus oxychloride ($POCl_2$) is added to the gas mixture mentioned under b. This first stage of the heat treatment lasts about 45 minutes.

d. Thereafter, during the second stage of the heat treatment, the temperature in the furnace is reduced to about 975° C., while the flow of gas in the furnace is changed into a flow of 5000 scc per minute of dry oxygen. The second stage lasts about 10 minutes.

e. During the third stage, the temperature in the furnace remains about 925° C., but the flow of gas then becomes 4250 scc of oxygen and 7500 scc of hydrogen per minute. This third stage lasts about 25 minutes.

f. Finally, the wafers are cooled in a flow of nitrogen of 5000 scc per minute in about 50 minutes to room temperature.

Measurements of wafers thus treated have shown that n-type semiconductor zones are formed having a depth of about $2/\mu m$ and a surface concentration of $10^{20}$ atoms per $cm^3$ in a p-type silicon wafer having a doping concentration of about $10^{18}$ atoms per $cm^3$.

What is claimed is:

1. A method of manufacturing a semiconductor device, in which a layer comprising silica and an oxide of a dopant is provided on a surface of a semiconductor body of silicon, after which the semiconductor body is subjected to a heat treatment at a temperature at which transport of the dopant takes place from its oxide to the semiconductor body, characterized in that the heat treatment is carried out at a first stage in an atmosphere comprising an inert gas to which about 25% by volume of oxygen is added, then at a second stage in an atmosphere of practically dry oxygen and thereafter at a third stage in an atmosphere comprising oxygen and hydrogen.

2. A method as claimed in claim 1, characterized in that a layer comprising silica and phosphorus pentoxide is provided on the surface of the semiconductor body.

3. A method as claimed in claim 2, characterized in that the layer comprising silica and phosphorus pentoxide is provided on the surface by application by spinning of a slurry comprising silica and phosphorus pentoxide in ethanol.

4. A method as claimed in claim 3, characterized in that the first stage of the heat treatment is carried out in an atmosphere of nitrogen to which 10 to 20% by volume of oxygen is added.

5. A method as claimed in claim 3 or 4, characterized in that during the first stage of the heat treatment phosphorus oxychloride ($POCl_3$) or phosphine ($PH_3$) is added to the inert atmosphere.

6. A method as claimed in claim 2, 3 or 4, characterized in that the heat treatment is carried out at a temperature of 925° to 1000° C.

* * * * *